United States Patent [19]

Singer

[11] Patent Number: 4,882,551
[45] Date of Patent: Nov. 21, 1989

[54] 400 HERTZ HARMONIC GENERATOR

[75] Inventor: Paul A. Singer, San Diego, Calif.

[73] Assignee: The United States of America as represented by the Secretary of the Navy, Washington, D.C.

[21] Appl. No.: 351,617

[22] Filed: May 11, 1989

[51] Int. Cl.$^4$ ............................................. H03B 29/00
[52] U.S. Cl. ....................................... 331/78; 364/717
[58] Field of Search ............................ 331/78; 364/717

[56] References Cited

U.S. PATENT DOCUMENTS

| | | |
|---|---|---|
| 3,845,484 | 10/1974 | Sawicki et al. . |
| 3,961,169 | 6/1976 | Bishop et al. ........................ 331/78 X |
| 4,013,966 | 3/1977 | Campbell . |
| 4,173,000 | 10/1979 | Singer et al. . |
| 4,375,620 | 3/1983 | Singer et al. . |
| 4,386,913 | 6/1983 | Assard . |
| 4,470,022 | 9/1984 | Cernius et al. . |
| 4,613,831 | 9/1986 | Loftness . |
| 4,673,871 | 9/1987 | Brown et al. . |

Primary Examiner—Eugene R. LaRoche
Assistant Examiner—Robert J. Pascal
Attorney, Agent, or Firm—Harvey Fendelman; Thomas Glenn Keough

[57] ABSTRACT

A signal generator includes a pseudo-random bit generator that feeds bits to three screening gates and three interconnected counters to simulate the electronic interference noise source attributed to three 400 hertz motors. The electronic interference effect includes fluctuations of frequencies to represent the slight variations in motor-generator speeds attributed to the 400 hertz motors so that a more realistic evaluation can be made on nearby communications and navigation equipments.

8 Claims, 2 Drawing Sheets

FIG. 2

| | PRBG Output $T_0$ $T_1$ $T_2$ | LSB $T_0$ $T_1$ $T_2$ | Input to 50 $T_0$ $T_1$ $T_2$ | MSB $T_0$ $T_1$ $T_2$ | Input to 40 $T_0$ $T_1$ $T_2$ | Input to 45 $T_0$ $T_1$ $T_2$ |
|---|---|---|---|---|---|---|
| Case 1 | 0 0 0 | 0 0 0 | 0 0 0 | 0 0 0 | 0 0 0 | 0 0 0 |
| Case 2 | 0 0 1 | 0 0 1 | 0 0 0 | 0 0 1 | 0 0 1 | 0 0 0 |
| Case 3 | 0 1 0 | 0 0 1 | 0 0 1 | 0 0 0 | 0 0 0 | 0 0 0 |
| Case 4 | 0 1 1 | 0 0 1 | 0 0 1 | 0 0 1 | 0 0 1 | 0 0 0 |
| Case 5 | 1 0 0 | 0 1 0 | 0 1 0 | 0 0 0 | 0 0 0 | 0 1 0 |
| Case 6 | 1 0 1 | 0 1 0 | 0 0 0 | 0 0 1 | 0 0 1 | 0 1 0 |
| Case 7 | 1 1 0 | 0 1 0 | 0 1 0 | 0 0 0 | 0 0 0 | 0 1 0 |
| Case 8 | 1 1 1 | 0 1 0 | 0 1 0 | 0 0 1 | 0 0 1 | 0 1 0 |

$T_0$ = initial time; $T_1$ = next time interval; $T_2$ = time interval after $T_1$

400 HERTZ HARMONIC GENERATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Successful operation of communications and navigation equipments aboard an aircraft usually requires that they are capable of functioning satisfactorily in the ambient electronic noise that is usually found aboard an operational aircraft. A bothersome source of electronic interference that frequently must be tolerated is attributed to the numerous motor-generator combinations running at 400 hertz. Although these combinations are intended to operate precisely at 400 hertz, they all seem to vary their speed slightly so that the electonic interference created by them fluctuates about 400 hertz.

To date one technique uses three precise frequency synthesizers set at slightly different frequencies and the outputs are mixed together. The disadvantages of this approach are that, in addition to tying up three general purpose generators, the frequencies generated did not have the ability to slightly vary to represent the slight variation in the motor-generator speeds associated with these units on the aircraft. As a consequence, a realistic test and evaluation of the equipments could not be made in a more accurate portrayal of the electronic noise environment aboard an operational aircraft.

Thus, a continuing need exists in the state-of-the-art for a frequency generator for the designers of and maintenance crews for aircraft communications and navigation equipments that is capable of simulating the fluctuating electronic interference attributed to motor-generator noise sources aboard an aircraft.

SUMMARY OF THE INVENTION

The present invention is directed to providing an apparatus for generating fluctuating frequencies to simulate the electronic interference attributed to motor-generator noise sources on an aircraft. A pseudo-random bit generator has its digital data stream of random zeros and ones demultiplexed by three screening gates which each feed a discrete data signal portion of the digital data stream to an interconnected counter. A first counter receives its discrete data signal portion of the digital data stream to provide discrete center counter output signals at a desired center frequency. The other two counters are designed to provide discrete upper and lower counter output signals at a predetermined magnitude above and below the desired center frequency. A low pass filter receiving the discrete center, upper and lower counter output signals provides analog output signals that are representative of the three counter output signals. Since the digital data stream that is coupled to the screening gates and interconnected counters is a series of random zeros and ones, the counter output signals fluctuate and vary inconsistently. As a consequence, the analog output signals fluctuate inconsistency to more accurately portray the electronic interference noise attributed to motor-generator noise sources aboard an aircraft.

An object of the invention is to provide a signal generator for simulating the electronic noises associated with airborne communications and navigation equipments.

Another object is to provide an electronic noise simulation that is modifiable to accommodate various frequency anomalies or frequency ranges.

Another object is to provide a signal generator having the capability of inconsistently varying the content of its output signal over a period of time.

Another object of the invention is to provide a signal generator capable of simulating the electronic interference attributed to small shifts in the frequencies produced by a number of motor-generator units.

Another object is to provide a cost effective electronic noise simulation that is repeatable to act as a standard.

These and other objects of the invention will become more readily apparent from the ensuing specification and drawings when taken in conjunction with the appended claims.

BRIEF DESCRIPTION OF THE DRAWINGS

FIG. 2 sets forth representations of the gating signals for their associated counters.

DESCRIPTION OF THE PREFERRED EMBODIMENT

Figure 1:
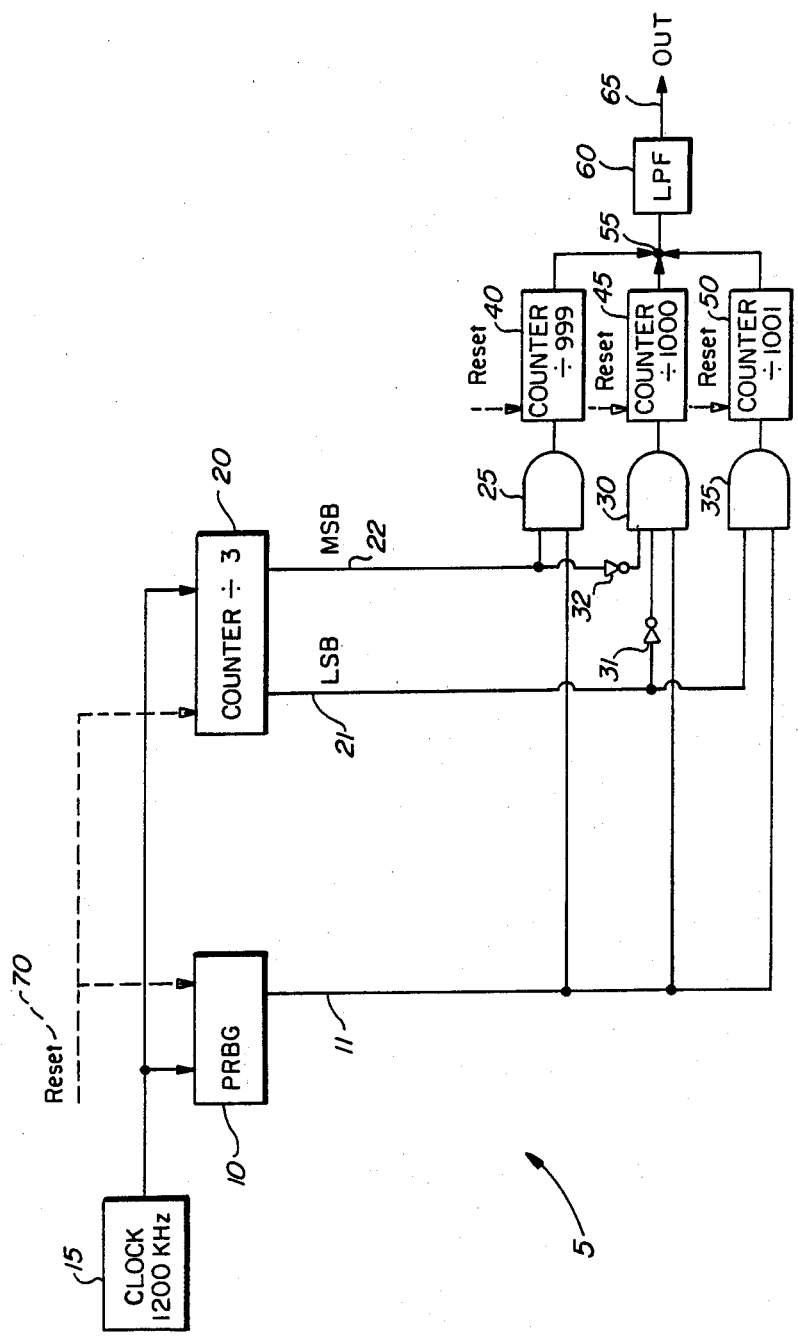
FIG. 1 shows a schematic diagram of an illustrative embodiment of this inventive concept.

Referring now to FIG. 1, an electronic interference generator 5 relies on a pseudo-random bit generator (PRBG) 10 for the generation of a digital data stream of random zeros and ones on its output lead 11. Pseudo-random bit generators of the type employed in the fabrication of this inventive concept are well known in the art and have been used widely for a variety of signal simulation and synthesis purposes, see for example the "Simulated VLF/LF Noise Generator" of U.S. Pat. No. 4,173,000 issued to Paul A. Singer et al on Oct. 30, 1979 and the "Pseudo-Atmospheric Noise Generator With Control of Temporal Characteristics" of U.S. Pat. No. 4,375,620 issued to Paul A. Singer et al. on Mar. 1, 1983.

The rate at which the digital data stream appears on lead 11 is controlled by a clock 15 which, in this illustrative embodiment, provides clock pulses at a 1200 kilohertz rate. The clock also feeds this pulse rate to an interconnected divide-by-3 counter circuit 20. The divide-by-3 counter provides a least significant bit (LSB) output on output lead 21 at a 400 kilohertz rate and a most significant bit output (MSB) signal at a 400 kilohertz rate on output lead 22.

Divide-by-3 counter 20 is made from a standard logic module, such as, for example, an RCA CMOS CD4018B. This counter is a standard divide-by-n counter that can be tailored to meet the needs of a particular switching sequence. It is to be understood that other divide-by ratios can be selected as a particular situation calls for, the divide by 3 function being herein selected for the purposes of demonstrating this inventive concept and is not to be intended as being limiting.

The digital data stream coming from PRBG 10 on lead 11 and the LSB and MSB from divide-by-3 counter 20 on leads 21 and 22 are fed to three screening gates 25, 30 and 35. The screening gates are standard CMOS elements of the CD 4000 series made by RCA. These elements are tailored to be actuated and to provide a desired output by one skilled in this particular art without the exercise of undue experimentation. Other designs and actuation sequences that are compatible with the other elements herein described could have been selected without departing from the intent and scope of this inventive concept. The screening gates and the divide-by-3 counter 20 cooperate to demultiplex the random digital data stream which is coupled to the gates via output lead 11. A pair of inverters 31 and 32 receive the LSB and MSB to assure the proper sequential actuation of gate 30 with the actuation of gate 25 and gate 35.

Screening gates 25, 30 and 35 allow only one-third of the random ones coming from PRBG 10 over output lead 11 from being applied to the input of its respectively interconnected counter 40, 45 or 50. This actuation creates a randomized output from each of the counters as explained below.

Each of counters 40, 45 and 50 is a divide by n counter such as the RCA CMOS CD4018B which can be appropriately acted upon by one skilled in this art to provide a desired divide-by ratio or function. The ratios or functions may be different one from the other to assure random varying output signals. In the illustrative embodiment, counter 40 provides a divide-by 999, counter 45 provides a divide by 1,000 and counter 50 provides a divide by 1,001. These divide-by ratios were found to be acceptable for the simulation of motor-generator electronic interference in an intended application. The ratios or the number of gates and counters could be varied depending on the requirements of a particular simulation.

The outputs of the three counters are summed at a summing point 55 and fed to a low pass filter 60 where the analog output signal will appear at an output terminal 65 as simulated fluctuating 400 hertz signals. Optionally, a reset 70 is provided for PRBG 10 and counters 20, 40, 45 and 50 so that electronic interference generator 5 can go back to an initial state.

In operation, screening gates 25, 30 and 35 allow only one-third of the random ones coming from PRBG 10 to reach each gate's respectively interconnected counter 40, 45 and 50. This is accomplished when control counter 20 provides the 400 kilohertz gating signals, LSB and MSB, and random ones from the digital data stream together are fed to screening gates 25, 30 and 35. Examples of these inputs and the signals which are gated through the screening gates and inputed to counters 30, 40 and 45 are shown in FIG. 2. Example pulse sequences for an initial time $T_0$, the next time interval $T_1$ and the time after interval $T_1$, $T_2$ are shown for eight representative cases of possible pulse sequences that might come over lead 11 from PRBG 10.

From FIG. 2 it is apparent that the PRBG digital data stream of random zeros and ones and the zeros and ones in the LSB and MSB cause outputed ones from the screening gates 25, 30 and 35 only upon the coincidental occurrence of ones. The zeros are not reflected in the transmitted signal except for the spacing and random occurrence that they introduce in the pulse sequence. The screening gates demultiplex the PRBG digital data stream in accordance with a divide-by-3 sequence for the interconnected counters.

The output from the PRBG is at the 1200 kilohertz clock rate although this rate selectably could be changed in accordance with a desired output signal. The output frequency of the LSB and MSB on output leads 21 and 22 is at 400 kilohertz, although this frequency also could be changed as need be. As mentioned above, counter 20 and gates 25, 30 and 35 act as demultiplexers for the digital data stream of random ones appearing on output lead 11. In the example given the output bits from the three screening gates are at a randomized 400 kilohertz so that the associated interconnected divide-by counters 40, 45 and 50 bring fluctuating 400 Hertz digital signals to summing point 55. The signals are coupled to the low pass filter 60 so that fluctuating 400 Hertz analog signals appear at output terminal 65.

The low cost, repeatable electronic interference generator can act as a standard due to the repeatability of the pseudo-random bit generator. Typically, over 6,000 hours of a unique pattern can be generated and the random small shifts of the simulated frequencies coming from low pass filter 60 at an output terminal 65 can simulate the shifts created by the motor-generators found aboard an aircraft.

The clock rate of clock 15 is changeable and counters 20, 40, 45 and 50, optionally, may be of the programmable type so that by modifying the setting of gates 25, 30 and 35 a wide variety of range of actuating sequences can be used. In addition, the divide-by feature of the counters is selectable to provide for additional flexibility.

Obviously, many modifications and variations of the present invention are possible in the light of the above teachings. It is therefore to be understood that within the scope of the appended claims the invention may be practiced otherwise than as specifically described.

I claim:

1. An apparatus for simulating a range of fluctuating electronic signals comprising:
    a clock having a predetermined clock signal;
    a psuedo-random bit generator means coupled to the clock for generating a digital data stream of random zeros and ones;
    divider means connected to said clock for providing gating signals at a predetermined rate of said clock signal;
    means connected to said pseudo random bit generator means to receive said digital data stream and connected to said divider providing means to receive said gating signals for demultiplexing said ones of said digital data stream into a plurality of random ones signals in accordance with said predetermined rate of said gating signals;
    means connected to said demultiplexing means for summing said plurality of said random ones signals;
    means coupled to receive said plurality of said random ones signals for filtering thereof to provide said range of said fluctuating signals.

2. An apparatus according to claim 1 further including:
    a plurality of counter means connected to said demultiplexing means for shifting the rate of each of said plurality of random ones signals to a plurality of random counter digital signals, each of said plurality of random counter digital signals being different from each other and together being the digital representation of said range of said fluctuating electronic interference signals.

3. An apparatus according to claim 2 in which said divider providing means is divide-by counter providing MSB and LSB gating signals.

4. An apparatus according to claim 3 in which said demultiplexing means is a plurality of screening gates each being coupled to receive at least LSB or MSB gating signals to assure said plurality of said random ones signals.

5. An apparatus according to claim 4 in which said plurality of said counter means is a plurality of divide-by counters each coupled to a separate one of said plurality of said screening gates and each said divide-by counter having a different divide-by ratio to assure different said random counter digital signals.

6. An apparatus according to claim 5 in which said clock provides said clock signal at a 1200 kilohertz rate, said pseudo random bit generator means provides said digital data stream of random zeros and ones at the 1200 kilohertz rate and said divider providing means has a divide-by 3 ratio.

7. An apparatus according to claim 6 in which three said screening gates are provided with each being connected to a separate said divide-by counter having divide-by ratios of 999, 1000 and 1001 respectively.

8. An apparatus according to claim 7 further including:
 a reset coupled to said pseudo random bit generator means, said divide-by counters and said divider providing means to reinitiate the apparatus.

* * * * *